(12) United States Patent
Park et al.

(10) Patent No.: US 10,841,527 B2
(45) Date of Patent: Nov. 17, 2020

(54) IMAGE SENSORS IN WHICH PIXEL ARRAY AND MEMORY CELL ARRAY ARE MERGED AND ELECTRONIC DEVICES INCLUDING THE SAME

(71) Applicant: Samsung Electronics Co., Ltd., Suwon-si (KR)

(72) Inventors: Seokhan Park, Seongnam-si (KR); Jaekyu Lee, Seongnam-si (KR); Kijae Hur, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/394,541

(22) Filed: Apr. 25, 2019

(65) Prior Publication Data

US 2020/0092506 A1 Mar. 19, 2020

(30) Foreign Application Priority Data

Sep. 13, 2018 (KR) .................. 10-2018-0109696

(51) Int. Cl.
*H04N 5/369* (2011.01)
*H01L 27/146* (2006.01)
(Continued)

(52) U.S. Cl.
CPC ......... *H04N 5/379* (2018.08); *G11C 11/4074* (2013.01); *G11C 11/4087* (2013.01); *H01L 23/481* (2013.01); *H01L 23/528* (2013.01); *H01L 25/18* (2013.01); *H01L 27/10814* (2013.01); *H01L 27/10897* (2013.01); *H01L 27/14634* (2013.01); *H01L 27/14636* (2013.01); *H04N 5/378* (2013.01);
(Continued)

(58) Field of Classification Search
CPC .. H04N 5/379; H04N 5/378; H01L 27/10897; H01L 23/528; H01L 23/481; H01L 27/14634; H01L 27/10814; H01L 27/14636; H01L 25/18; H01L 27/14618; H01L 27/14621; H01L 27/14612; H01L 27/14627; G11C 11/4087; G11C 11/4074
See application file for complete search history.

(56) References Cited

U.S. PATENT DOCUMENTS 6,563,187 B1    5/2003   Park
6,949,388 B2    9/2005   Park
(Continued)

FOREIGN PATENT DOCUMENTS

KR        10-0464955 B1     4/2005

*Primary Examiner* — Yogesh K Aggarwal
(74) *Attorney, Agent, or Firm* — Harness, Dickey & Pierce, P.L.C.

(57) ABSTRACT

An image sensor in which a pixel array and a memory cell array are merged includes a first semiconductor chip including the pixel array and the memory cell array in a same semiconductor chip, and a second semiconductor chip overlapping the first semiconductor chip in a vertical direction. The second semiconductor chip includes a first logic circuit that controls the pixel array, an analog-to-digital converter (ADC) that converts an analog signal output from the pixel array under control of the first logic circuit to a digital signal, and a second logic circuit that stores data that is output from the ADC circuit based on the digital signal to the memory cell array of the first semiconductor chip.

17 Claims, 10 Drawing Sheets

(51) Int. Cl.
    *H01L 23/528* (2006.01)
    *G11C 11/408* (2006.01)
    *H01L 27/108* (2006.01)
    *H01L 23/48* (2006.01)
    *G11C 11/4074* (2006.01)
    *H01L 25/18* (2006.01)
    *H04N 5/378* (2011.01)

(52) U.S. Cl.
    CPC .. *H01L 27/14612* (2013.01); *H01L 27/14618* (2013.01); *H01L 27/14621* (2013.01); *H01L 27/14627* (2013.01)

(56) References Cited

U.S. PATENT DOCUMENTS

| | | |
|---|---|---|
| 8,766,389 B2 | 7/2014 | Sato |
| 9,515,115 B2 | 12/2016 | Maruyama |
| 9,521,348 B2 | 12/2016 | Shen et al. |
| 9,564,464 B2 | 2/2017 | Madurawe et al. |
| 9,899,443 B2 | 2/2018 | Lee et al. |
| 10,142,567 B2 * | 11/2018 | Colonero ............... H04N 5/378 |
| 2017/0295335 A1 | 10/2017 | Kim |
| 2018/0091726 A1 * | 3/2018 | Furumochi ............ H04N 5/378 |

\* cited by examiner

IMAGE SENSORS IN WHICH PIXEL ARRAY AND MEMORY CELL ARRAY ARE MERGED AND ELECTRONIC DEVICES INCLUDING THE SAME

CROSS-REFERENCE TO RELATED APPLICATIONS

This application claims priority under 35 U.S.C. § 119 to Korean Patent Application No. 10-2018-0109696 filed on Sep. 13, 2018, in the Korean Intellectual Property Office, the disclosures of which are incorporated by reference herein in their entireties.

BACKGROUND

Example embodiments of the inventive concepts disclosed herein relate to image sensors and electronic devices, and more particularly, relate to image sensors in which a pixel array and a memory cell array are merged and electronic devices including the same.

Image sensors may be used in mobile devices, such as smartphones, tablets, digital cameras, and various electronic devices. As image sensors are used in various electronic devices supporting various functions, a technology for making the image sensor small and storing a captured image therein is required.

Nowadays, image sensors that include stacked semiconductor chips are being developed. A pixel array may be formed in any one semiconductor chip, and a logic circuit may be formed in another semiconductor chip. Another semiconductor chip may be used in the image sensor for storing an image. However, since each of the semiconductor chips supports communication between the semiconductor chips for transmitting an image, image sensors implemented in the above-described scheme may be inappropriate for miniaturization and low power.

SUMMARY

Example embodiments of the inventive concepts provide image sensors in which a pixel array and a memory cell array are merged and electronic devices including the same.

According to some example embodiments, an image sensor in which a pixel array and a memory cell array are merged may include a first semiconductor chip including the pixel array and the memory cell array in a same semiconductor chip, and a second semiconductor chip overlapping the first semiconductor chip in a vertical direction. The second semiconductor chip may include a first logic circuit configured to control the pixel array, an analog-to-digital converter (ADC) circuit configured to convert an analog signal that is output from the pixel array under control of the first logic circuit to a digital signal, and a second logic circuit configured to store data that is output from the ADC circuit based on the digital signal to the memory cell array.

According to some example embodiments, an image sensor may include a first semiconductor chip including a pixel array and a dynamic random access memory (DRAM) cell array in a same semiconductor chip, and a second semiconductor chip overlapping the first semiconductor chip in a vertical direction. The second semiconductor chip may be to control the pixel array and the DRAM cell array. The second semiconductor chip may be configured to receive an analog signal output from the pixel array through a first path between the first semiconductor chip and the second semiconductor chip, convert the analog signal to a digital signal, and transmit data that is based on the digital signal to the DRAM cell array of the first semiconductor chip through a second path between the first semiconductor chip and the second semiconductor chip.

According to some example embodiments, an electronic device may include an image sensor including a first semiconductor chip and a second semiconductor chip, the second semiconductor chip overlapping the first semiconductor chip in a vertical direction, and a host configured to receive and process output data output from the image sensor. The first semiconductor chip may include a pixel array and a memory cell array in a same semiconductor chip. The second semiconductor chip may be configured to convert an analog signal output from the pixel array to a digital signal and store image data based on the digital signal to the memory cell array of the first semiconductor chip.

DETAILED DESCRIPTION

Below, example embodiments of the inventive concepts will be described in detail and clearly to such an extent that an ordinary one in the art easily implements the inventive concepts. The inventive concepts relates to an image sensor in which a pixel array and a memory cell array are merged. The image sensor may be classified as a charge coupled device (CCD) image sensor or a complementary metal-oxide semiconductor (CMOS) image sensor (CIS). Below, it is assumed that the image sensor is the CIS, but the inventive concepts is not limited thereto.

Figure 1:
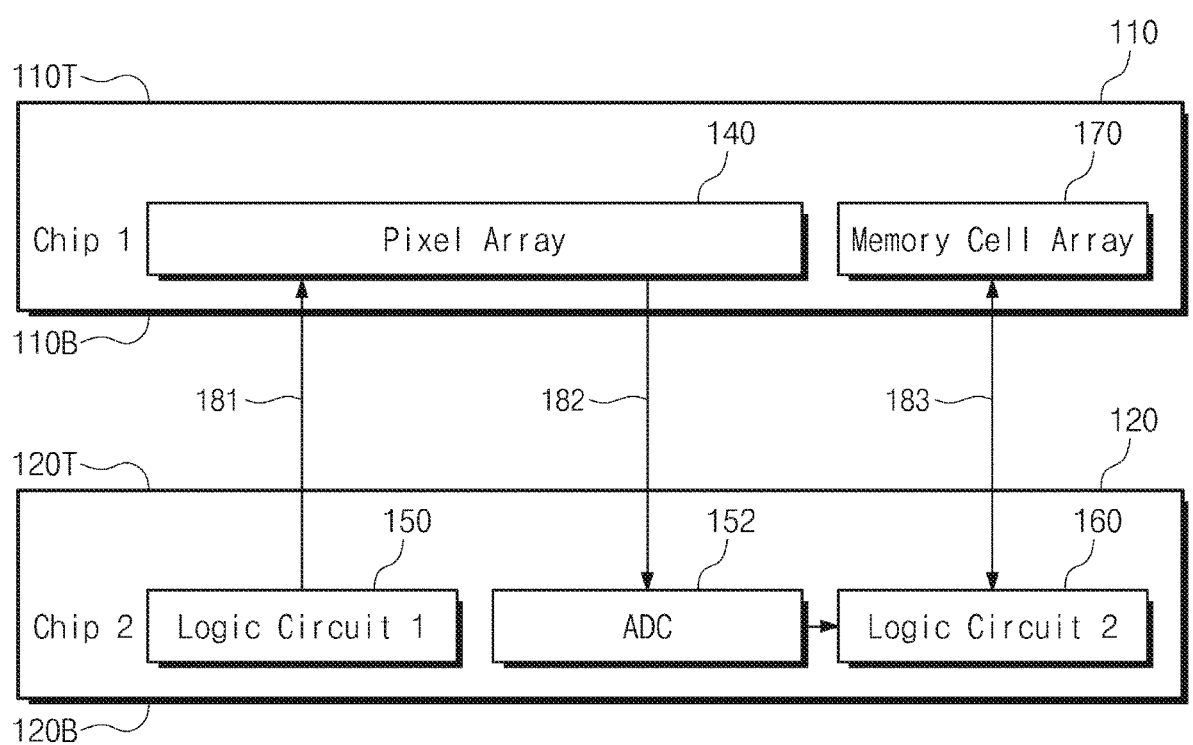
FIG. 1 is a block diagram illustrating an image sensor according to some example embodiments of the inventive concepts.

FIG. 1 is a block diagram illustrating an image sensor according to some example embodiments of the inventive concepts. An image sensor 10 may include a first semiconductor chip 110 and a second semiconductor chip 120. The first semiconductor chip 110 and the second semiconductor chip 120 may be positioned to overlap each other in a top view or a plan view. Restated, and as shown in at least FIG. 1, the first semiconductor chip 110 may be vertically stacked on the second semiconductor chip 120, such that the second semiconductor chip 120 overlaps the first semiconductor chip 110 in a vertical direction, shown in FIG. 1 as a Y direction. As shown in FIG. 1, the vertical direction (Y direction) extends perpendicular to respective top and bottom surfaces 110T and 110B of the first semiconductor chip 110 and respective top and bottom surfaces 120T and 120B of the second semiconductor chip 120. The first semiconductor chip 110 may be referred to as an "image sensor chip", and the second semiconductor chip 120 may be referred to as a "logic chip".

The first semiconductor chip 110 may include a pixel array 140 and a memory cell array 170, and thus includes the pixel array 140 and memory cell array 170 in a same semiconductor chip. The second semiconductor chip 120 may include a first logic circuit 150, an analog digital converter (ADC) 152 (also referred to herein as an "ADC circuit"), and a second logic circuit 160. The first logic circuit 150 may be configured to control the pixel array 140 via one or more paths 181 that are between the first semiconductor chip 110 and the second semiconductor chip 120. Under control of the first logic circuit 150, the pixel array 140 may convert an optical image to an electrical signal, that is, an analog signal and may output ("transmit") the analog signal to the ADC 152 via one or more paths 182 that are between the first semiconductor chip 110 and the second semiconductor chip 120. The ADC 152 may be configured to convert the analog signal that is output from the pixel array 140 that is under control of the first logic circuit 150, via one or more paths 182 between the first semiconductor chip 110 and the second semiconductor chip 120, to a digital signal and may provide data (an image generated by the pixel array 140), which is based on the digital signal, to the second logic circuit 160. The second logic circuit 160 may store the data that is output from the ADC 152 based on the digital signal to the memory cell array 170. Restated, the second logic circuit 160 may transmit the data to the memory cell array 170 through one or more second paths 183 between the first semiconductor chip 110 and the second semiconductor chip 120. Accordingly, in some example embodiments, the second semiconductor chip 120 may be configured to control the pixel array 140 and the memory cell array 170. It will be understood, as described above, that each of the first logic circuit 150, the ADC 152, and the second logic circuit 160 may be an instance of circuitry, including a processor, instance of processing circuitry, some combination thereof, or the like.

The data may be image data generated by the frame. The number of bits of the data may be determined based on a resolution of the ADC 152. The number ("quantity") of bits of the data may be determined based on a high dynamic range (HDR) which the image sensor 10 supports. Also, the bits of the data may further include at least one extension bit indicating a data-generated location, information of the data, etc.

The second logic circuit 160 and the memory cell array 170 may configure a memory device. A kind of a memory device may be determined according to a kind of a memory cell in the memory cell array 170. For example, the memory device may be any one of a dynamic random access memory (DRAM) device, a static random access memory (SRAM) device, a thyristor random access memory (TRAM) device, a flash memory device, a phase-change random access memory (PRAM) device, a magneto-resistive random access memory (MRAM) device, a resistive random access memory (ReRAM) device, and a ferro-electric random access memory (FRAM) device. Below, it is assumed that the second logic circuit 160 supports a double data rate (DDR) interface for data input/output, the memory cell array 170 includes DRAM cells, and the second logic circuit 160 and the memory cell array 170 configure a DRAM device.

Referring to FIG. 1, the pixel array 140 and the memory cell array 170 may be merged in the first semiconductor chip 110. Unlike illustration of FIG. 1, in the case where the memory cell array 170 for storing data is implemented at any other semiconductor chip (not illustrated), not the first semiconductor chip 110, the second semiconductor chip 120 may further include circuits for communicating with the other semiconductor chip. For example, in the case where the other semiconductor chip is positioned under the second semiconductor chip 120 (i.e., in the case where the second semiconductor chip 120 is stacked on the other semiconductor chip), paths for communication between the second semiconductor chip 120 and the other semiconductor chip, which may include a plurality of paths may be implemented at the second semiconductor chip 120. Accordingly, the area and power consumption of the second semiconductor chip 120 may increase. As described herein, a "path" may include a conductive trace, a conductive line, a conductive conduit, a conductive pattern, a wiring line, a contact of conductive patterns, a through silicon via (TSV), a back via stack (BVS), wire bonding, a combination thereof, or the like.

Unlike the above description, according to the inventive concepts, since the pixel array 140 and the memory cell array 170 are merged in the first semiconductor chip 110, paths for communication between the first semiconductor chip 110 and the second semiconductor chip 120 are formed at the second semiconductor chip 120, but paths for communication between the second semiconductor chip 120 and the other semiconductor chip are not formed at the second semiconductor chip 120. Also, both the first logic circuit 150 configured to control the pixel array 140 and the second logic circuit 160 configured to control the ADC 152 and the memory cell array 170 are merged in the second semiconductor chip 120. Accordingly, to transmit data output from the ADC 152 to the second logic circuit 160, internal wiring lines of the second semiconductor chip 120 may be used instead of a through silicon via (TSV), a back via stack (BVS), or Cu—Cu (a contact of conductive patterns) which may connect chips. Also, since both the first logic circuit 150 and the second logic circuit 160 are merged in the second semiconductor chip 120, the above-described wiring lines may be optimized within the second semiconductor chip 120. According to the inventive concepts, the image sensor 10 may have a 2-stack structure, in which the first semiconductor chip 110 and the second semiconductor chip 120 are stacked, instead of a 3-stack structure.

In some example embodiments, the second semiconductor chip 120 may further include an embedded processor, which processes data output from the pixel array 140 or data output from the memory cell array 170 (e.g., image data), such as an image signal processor (ISP) or a digital signal processor (DSP). The processor may reduce the noise of image data, may calibrate an image, or may perform follow-up operations associated with an image output from the pixel array 140.

Figure 2:
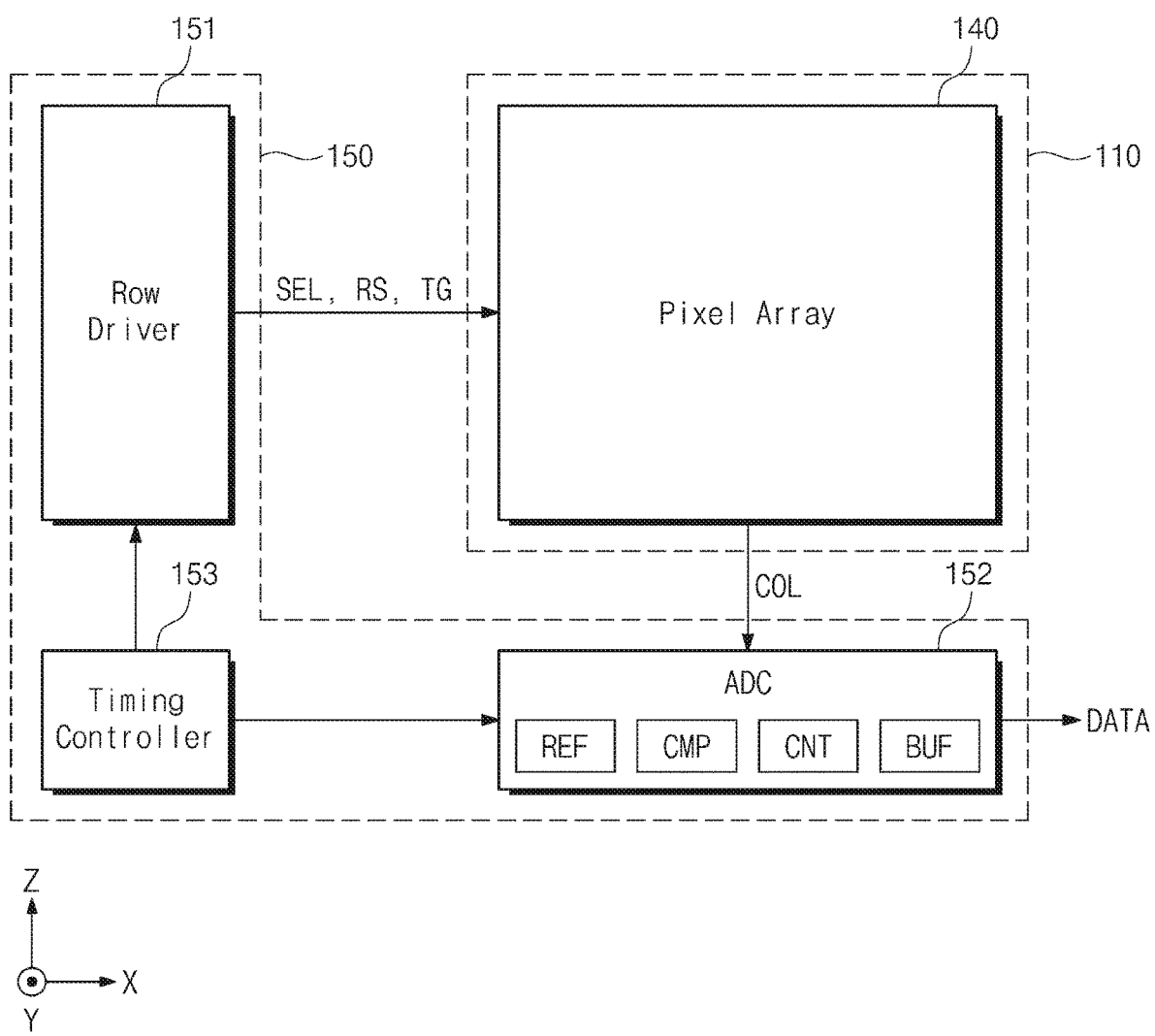
FIG. 2 is a diagram illustrating a first pixel array, a first logic circuit, and an ADC of FIG. 1 in detail according to some example embodiments of the inventive concepts.

FIG. 2 is a diagram illustrating a first pixel array, a first logic circuit, and an ADC of FIG. 1 in detail. As described above, the pixel array 140 may be implemented in the first semiconductor chip 110, and the first logic circuit 150 (refer to FIG. 1) may be implemented in the second semiconductor chip 120.

The pixel array 140 may convert an incident light and may generate an electrical signal. The pixel array 140 may include pixels arranged in a matrix form along a row direction and a column direction. The first logic circuit 150 may be configured to control the pixel array 140, such that the pixel array 140 may be driven under control of the first logic circuit 150 of FIG. 1.

The first logic circuit 150 may receive data efficiently from the pixel array 140 and may generate an image frame. For example, the first logic circuit 150 may use a global shutter manner in which all pixels are simultaneously sensed, a flutter shutter manner in which all pixels are simultaneously sensed and an exposure time is adjusted, a rolling shutter manner in which pixels are controlled by the row, a coded rolling shutter manner, etc. The first logic circuit 150 may include a row driver 151, the ADC 152, and a timing controller 153.

The row driver 151 may control pixels of the pixel array 140 for each row under control of the timing controller 153. The row driver 151 may select at least one of rows in the pixel array 140 depending on a row address. To this end, the row driver 151 may decode the row address and may activate selection lines SEL, reset lines RS, and transmission lines TG. The row driver 151 may be connected to the pixel array 140 through the selection lines SEL, the reset lines RS, and the transmission lines TG.

The ADC 152 may be connected to the pixel array 140 through column lines COL, which may be included in the one or more paths 182 that are between the first semiconductor chip 110 and the second semiconductor chip 120. The ADC 152 may convert analog signals received from the pixel array 140 through the column lines COL to digital signals. The number of ADCs 152 may be determined based on the number of pixels belonging to one row and the number of column lines COL, and the number of ADCs 152 may be at least one or more.

For example, the ADC 152 may include a reference signal generator REF, a comparator CMP, a counter CNT, and a buffer BUF. The reference signal generator REF may generate a ramp signal having a particular slope and may provide the ramp signal as a reference signal of the comparator CMP. The comparator CMP may compare an analog signal and the ramp signal of the reference signal generator REF and may output a comparison signal having transition time points each corresponding to an effective signal component. The counter CNT may perform a counting operation, may generate a counting signal, and may provide the counting signal to the buffer BUF. The buffer BUF may include latch circuits respectively connected to the column lines COL, and may latch a counting signal from the counter CNT for each column in response to a transition of a comparison signal and may output the latched counting signal as data.

In some example embodiments, the first logic circuit 150 may further include correlated double sampling (CDS) circuits which perform correlated double sampling on a difference between a reference voltage indicating a reset state of pixels and an output voltage indicating a signal component corresponding to an incident light and outputs an analog sampling signal corresponding to an effective signal component. The correlated double sampling circuits may be connected to the column lines COL.

The timing controller 153 may control timings associated with operations of the row driver 151 and the ADC 152. The timing controller 153 may provide a timing signal and a control signal to the row driver 151 and the ADC 152. In detail, the timing controller 153 may control the ADC 152, and the ADC 152 may provide data to the second logic circuit 160 under control of the timing controller 153. Also, the timing controller 153 may further include circuits (not illustrated) which provide a request, a command, or an address to the second logic circuit 160 so that data of the ADC 152 are stored to the memory cell array 170.

Figure 3:
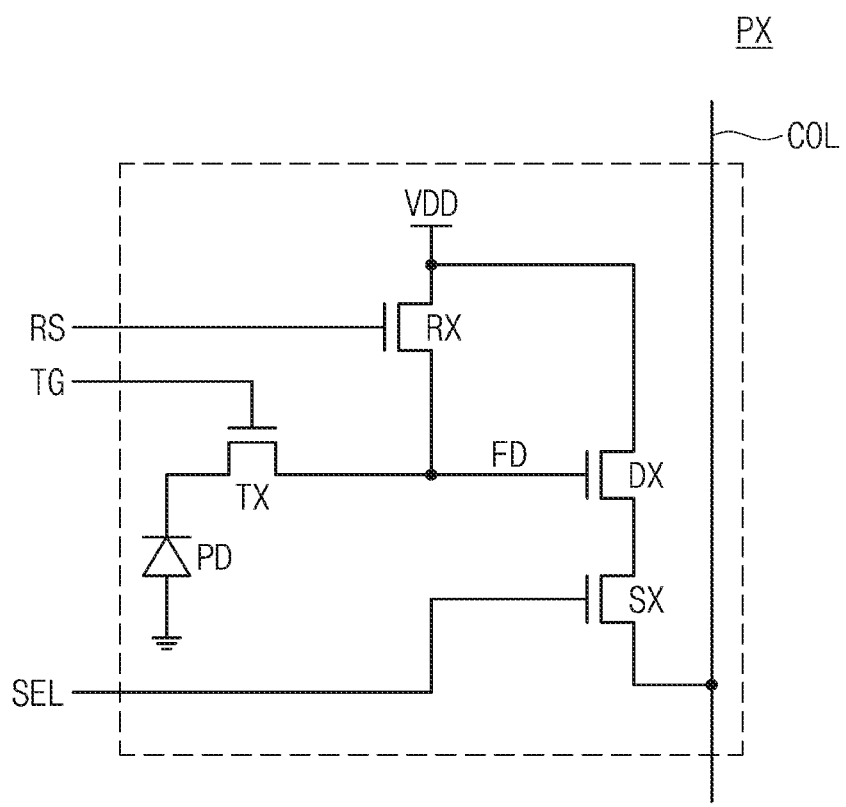
FIG. 3 is a block diagram illustrating one pixel included in a pixel array of FIG. 2 according to some example embodiments of the inventive concepts.

FIG. 3 is a block diagram illustrating one pixel included in a pixel array of FIG. 2. A pixel PX may be referred to as a "unit pixel", which is used to configure the pixel array 140. The pixel PX may generate an electrical signal based on a received light and may output the electrical signal to a column line COL. The pixel PX may include a photo diode PD as a photo sensitive device. The pixel PX may be a readout circuit and may include a transmission transistor TX, a reset transistor RX, a drive transistor DX, and a selection transistor SX.

The photo diode PD may receive a light (e.g., a visible light or an infrared light) from the outside and may generate a photo charge based on the received light. In another example, a pixel may include a photo transistor, a photo gate, or a pinned photo diode together with the photo diode PD or instead of the photo diode PD. The photo charge generated from the photo diode PD may be transmitted to a floating diffusion node FD through the transmission transistor TX.

The transmission transistor TX may electrically connect the photo diode PD to the floating diffusion node FD depending on a logical level of a signal on a transmission line TG. For example, in the case where the signal on the transmission line TG is at any logical level (e.g., a high level) and thus the transmission transistor TX is turned on, the photo charge generated from the photo diode PD may be transmitted to the floating diffusion node FD through the transmission transistor TX.

The reset transistor RX may reset the floating diffusion node FD depending on a logical level of a signal on a reset line RS. For example, the reset transistor RX may electrically connect the floating diffusion node FD to a power supply voltage VDD periodically or randomly and may charge the floating diffusion node FD to the power supply voltage VDD.

The drive transistor DX may operate to be similar to a source follower depending on a signal (i.e., a voltage of a gate terminal of the drive transistor DX) corresponding to charges charged at the floating diffusion node FD. The drive transistor DX may provide the selection transistor SX with a voltage determined based on a voltage of the floating diffusion node FD. The drive transistor DX may be connected between the power supply voltage VDD and the selection transistor SX.

The selection transistor SX may electrically connect the drive transistor DX to the column line COL depending on a logical level of a signal on a selection line SEL. The selection transistor SX may provide a signal or a voltage provided from the drive transistor DX to the column line COL.

Figure 4:
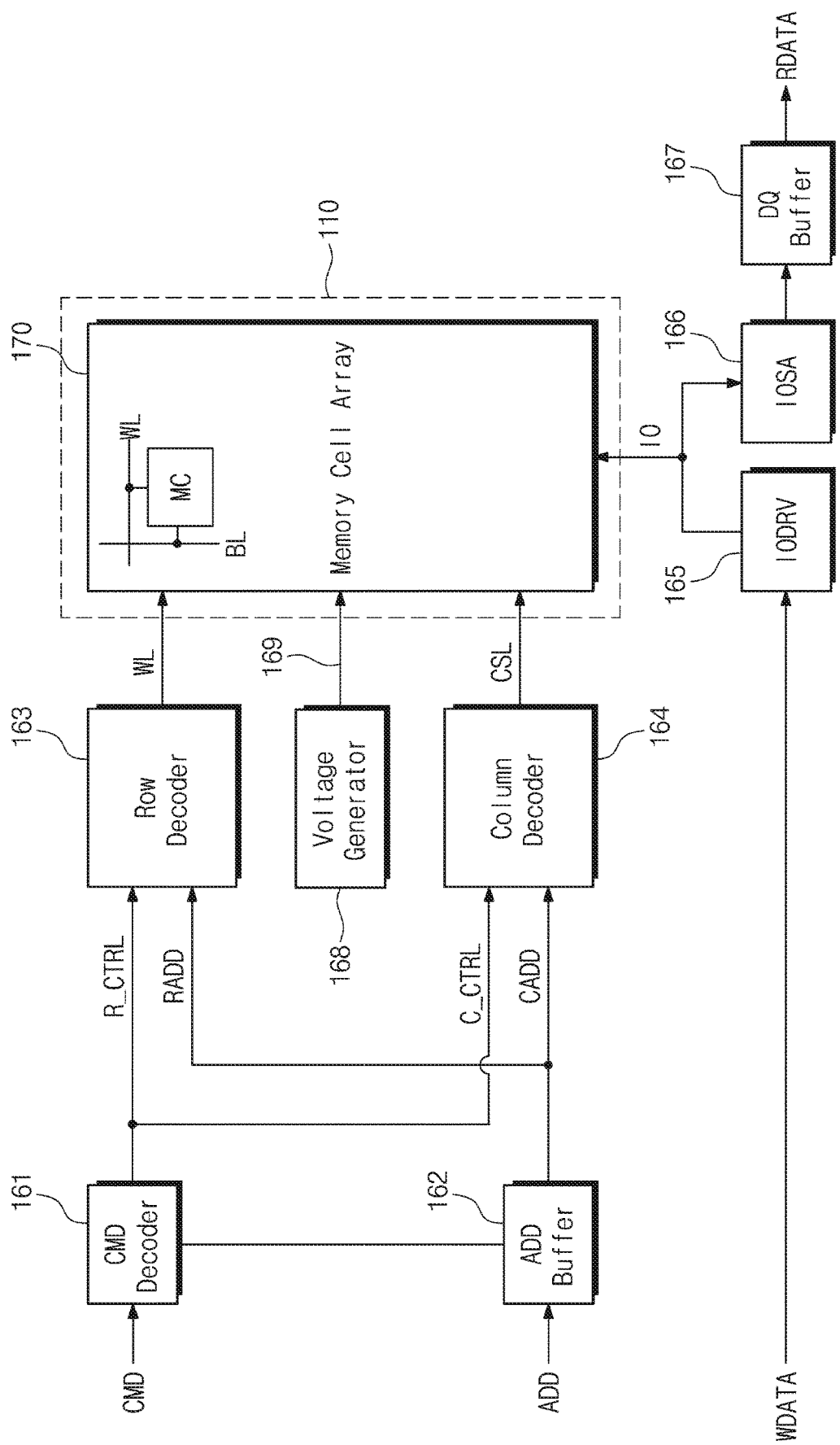
FIG. 4 is a block diagram illustrating a memory cell array and a second logic circuit of FIG. 1 in detail according to some example embodiments of the inventive concepts.

FIG. 4 is a block diagram illustrating a memory cell array and a second logic circuit of FIG. 1 in detail. The memory cell array 170 may be implemented in the first semiconductor chip 110. In contrast, all components of the second logic circuit 160 (refer to FIG. 1) may be implemented in the second semiconductor chip 120. Unlike the above description, some of the components of the second logic circuit 160 may be implemented in the first semiconductor chip 110, or the remaining components of the second logic circuit 160 may be implemented in the second semiconductor chip 120. The components of the second logic circuit 160 may be distributed and positioned into the first semiconductor chip 110 and the second semiconductor chip 120. That is, the second logic circuit 160 may be implemented in the first semiconductor chip 110 or the second semiconductor chip 120. The second logic circuit 160 may store data, which are based on an analog signal(s) output from the pixel array 140, to the memory cell array 170 under control of the first logic circuit 150.

The second logic circuit 160 may include a command decoder 161 (also referred to herein as a command decoder circuit), an address buffer 162 (also referred to herein as an address buffer circuit), a row decoder 163 (also referred to herein as a row decoder circuit), a column decoder 164 (also referred to herein as a column decoder circuit), an input/output driver 165 (also referred to herein as a input/output driver circuit), an input/output sense amplifier 166 (also referred to herein as a input/output sense amplifier circuit), a DQ buffer 167 (also referred to herein as a DQ buffer circuit), and a voltage generator 168 (also referred to herein as a voltage generator circuit). An example is illustrated in FIG. 4 as each of the components 161, 162, 163, 164, 165, 166, 167, and 168 is implemented with one component, but each component may be implemented with at least two or more components depending on the capacity, an operating speed, etc. of the memory cell array 170.

The command decoder 161 may decode a command CMD, and may control the address buffer 162, the row decoder 163, the column decoder 164, the input/output driver 165, the input/output sense amplifier 166, the DQ buffer 167, and the voltage generator 168. The voltage generator 168 may be configured to generate a voltage to drive the memory cell array 170 and may provide the voltage to the memory cell array 170 through a path (e.g., conductive line) 169 between the first semiconductor chip 110 and the second semiconductor chip 120. The command decoder 161 may be implemented or positioned within the second semiconductor chip 120. The command CMD may include a command, which is associated with the memory cell array 170, such as an activate command, a precharge command, a refresh command, a write command, or a read command.

For example, the command CMD may be provided from the first logic circuit 150 of FIG. 1. Since both the first logic circuit 150 and the second logic circuit 160 according to some example embodiments of the inventive concepts are implemented within the same semiconductor chip, that is, the second semiconductor chip 120, the command CMD may be determined according to the way to design the second semiconductor chip 120 and may not be defined in the JEDEC standard. Also, the command CMD may be provided from an external device (e.g., a host, a memory controller, or a processor) of the image sensor 10, as well as the first logic circuit 150. The command CMD may be defined in compliance with the JEDEC standard or the DDR interface associated with DRAM devices such as a double data rate synchronous DRAM (DDR SDRAM), a DDR2 SDRAM, a DDR3 SDRAM, a DDR4 SDRAM, a DDR5 SDRAM, a low power double data rate (LPDDR) SDRAM, an LPDDR2 SDRAM, an LPDDR3 SDRAM, an LPDDR4 SDRAM, an LPDDR5 SDRAM, a high bandwidth memory (HBM), HBM2, and HBM3. That is, the command decoder 161 may decode both a command CMD generated within the second semiconductor chip 120 and a command CMD provided from an external device.

The address buffer 162 may receive an address ADD under control of the command decoder 161. The address buffer 162 may be implemented or positioned within the second semiconductor chip 120. For example, in the case where the command decoder 161 receives the activate command, the address buffer 162 may provide the received address ADD to the row decoder 163 as a row address RADD. In the case where the command decoder 161 receives the write command or the read command, the address buffer 162 may provide the received address ADD to the column decoder 164 as a column address CADD. As in the command CMD, the address ADD may be provided from the external device or the first logic circuit 150. The address buffer 162 may also receive the row address RADD and the column address CADD from the external device or the first logic circuit 150. A range of the address ADD may be determined according to the size of data provided from the ADC 152, a capacity of the memory cell array 170, the number ("quantity") of word lines WL of the memory cell array 170, the number of column selection lines CSL, and the number of bit lines BL for each column selection line CSL.

In some example embodiments, the address ADD may be internally generated in the second semiconductor chip 120. As described above, the address ADD may be generated and provided by the first logic circuit 150 together with the command CMD. For another example, the first logic circuit 150 may generate only the command CMD, and the address ADD may be generated by the second logic circuit 160 based on the command CMD of the first logic circuit 150. In this case, the second logic circuit 160 may include an address generator, a row address generator, or a column address generator instead of the address buffer 162.

The row decoder 163 may decode the row address RADD based on a row control signal R_CTRL generated by the command decoder 161. When the command decoder 161 receives the activate command, the row decoder 163 may select or activate at least one of the word lines WL of the memory cell array 170 based on a decoding result of the row address RADD. When the command decoder 161 receives the precharge command, the row decoder 163 may deselect or deactivate the word line which is selected or activated based on the row control signal R_CTRL.

The row decoder 163 may refresh one or more memory cells MC of the memory cell array 170 by periodically activating at least one of the word lines WL of the memory cell array 170. For example, to refresh the memory cell array 170, the first logic circuit 150 may provide the refresh command to the command decoder 161. In this case, the second logic circuit 160 may further include an address generator which generates and updates the row address RADD depending on the refresh command. For another example, the second logic circuit 160 may perform a refresh operation without a request of the first logic circuit 150 or the external device (i.e., may perform a self-refresh operation). In this case, the second logic circuit 160 may include internal circuits (e.g., a timer, a command generator, and an address generator) which periodically generate the refresh command and the row address RADD.

The row decoder 163 may be positioned at the first semiconductor chip 110 and/or the second semiconductor chip 120. For example, the row decoder 163 may be positioned at only one of the first semiconductor chip 110 and the second semiconductor chip 120. For another example, sub circuits of the row decoder 163 may be distributed and positioned at the first semiconductor chip 110 and the second semiconductor chip 120.

The column decoder 164 may decode the column address CADD based on a column control signal C_CTRL generated by the command decoder 161. The column decoder 164 may select or activate at least one of the column selection lines CSL of the memory cell array 170 based on a decoding result of the column address CADD. The column decoder 164 may deselect or deactivate the column selection line which is selected or activated based on the column control signal C_CTRL. The column decoder 164 may be positioned in the first semiconductor chip 110 and/or the second semiconductor chip 120. For example, the column decoder 164 may be positioned at only one of the first semiconductor chip 110 and the second semiconductor chip 120. For another example, sub circuits of the column decoder 164 may be distributed and positioned at the first semiconductor chip 110 and the second semiconductor chip 120.

The input/output driver 165 may write or store data to the memory cell array 170 under control the command decoder 161. The data may be provided from the ADC 152 based on the digital signal converted by the ADC 152, where the digital signal includes one or more bits, or may be referred to as "write data WDATA". The input/output driver 165 may provide one or more bits of the data to at least one memory cell selected by the row decoder 163 and the column decoder 164 through an input/output line IO. Only the input/output line IO is illustrated in FIG. 4, but the input/output driver 165 may provide one or more bits of data to at least one selected memory cell through an input/output line IO and a complementary input/output line IOB. The input/output driver 165 may drive the input/output line IO and the complementary input/output line IOB in a differential manner based on logic states of the data. The input/output driver 165 (also referred to herein as one or more driver circuits configured to drive the input output line IO and/or complementary input/output line IOB, referred to herein collectively as a plurality of input/output lines) may be positioned at the first semiconductor chip 110 or the second semiconductor chip 120. For example, the input/output driver 165 may be positioned at only any one of the first semiconductor chip 110 and the second semiconductor chip 120. For another example, sub circuits of the input/output driver 165 may be distributed and positioned at the first semiconductor chip 110 and the second semiconductor chip 120.

The input/output sense amplifier 166 may read data stored in the memory cell array 170 under control the command decoder 161. The data read by the input/output sense amplifier 166 may be referred to as "read data RDATA". The input/output sense amplifier 166 may sense data output through the input/output line IO and the complementary input/output line IOB from at least one memory cell selected by the row decoder 163 and the column decoder 164. The input/output sense amplifier 166 may determine logic states of data by sensing voltage levels of the input/output line IO and the complementary input/output line IOB in a differential manner. The input/output sense amplifier 166 may provide the sensed data to the DQ buffer 167. The input/output sense amplifier 166 may be positioned at the first semiconductor chip 110 or the second semiconductor chip 120. For example, the input/output sense amplifier 166 may be positioned at only any one of the first semiconductor chip 110 and the second semiconductor chip 120. For another example, sub circuits of the input/output sense amplifier 166 may be distributed and positioned at the first semiconductor chip 110 and the second semiconductor chip 120.

Under control of the command decoder 161, the DQ buffer 167 may receive data provided from the input/output sense amplifier 166 and may output the data to the external device as read data. The DQ buffer 167 may output data to the external device based on the DDR interface of the above-described manners. Although not illustrated in FIG. 4, the second logic circuit 160 may further output a data strobe signal DQS to the external device together with the data.

The voltage generator 168 may generate voltages for driving the memory cell array 170 based on the power supply voltages VDD and VSS from the outside. For example, the voltages may include a high voltage VPP higher than the power supply voltage VDD and a low voltage VBB2 lower than the power supply voltage VSS. The voltages VPP and VBB2 may be used to select or deselect word lines. The voltage generator 168 may further generate a voltage VBLP for precharging various lines positioned in the memory cell array 170.

As shown in at least FIG. 4, memory cell array 170 may include a plurality of memory cells arranged in a matrix form along a row direction and a column direction. The memory cell array 170 may be divided into a plurality of banks. Each of the memory cells may be connected to one word line WL and one bit line BL. Accordingly, the memory cell array 170 may include a plurality of word lines WL and a plurality of bit lines BL connected to the plurality of memory cells MC. Each memory cell MC of the plurality of memory cells MC of the memory cell array 170 may include a DRAM cell which includes one transistor connected to one word line WL and one bit line BL and a capacitor connected to the transistor. Accordingly, the memory cell array 170 may be a DRAM cell array. Of course, the memory cell MC may be an SRAM cell, a TRAM cell, a flash memory cell, a PRAM cell, an MRAM cell, a ReRAM cell, or a FRAM cell. As described above, the memory cell array 170 may be implemented and positioned at the first semiconductor chip 110.

Figure 5:
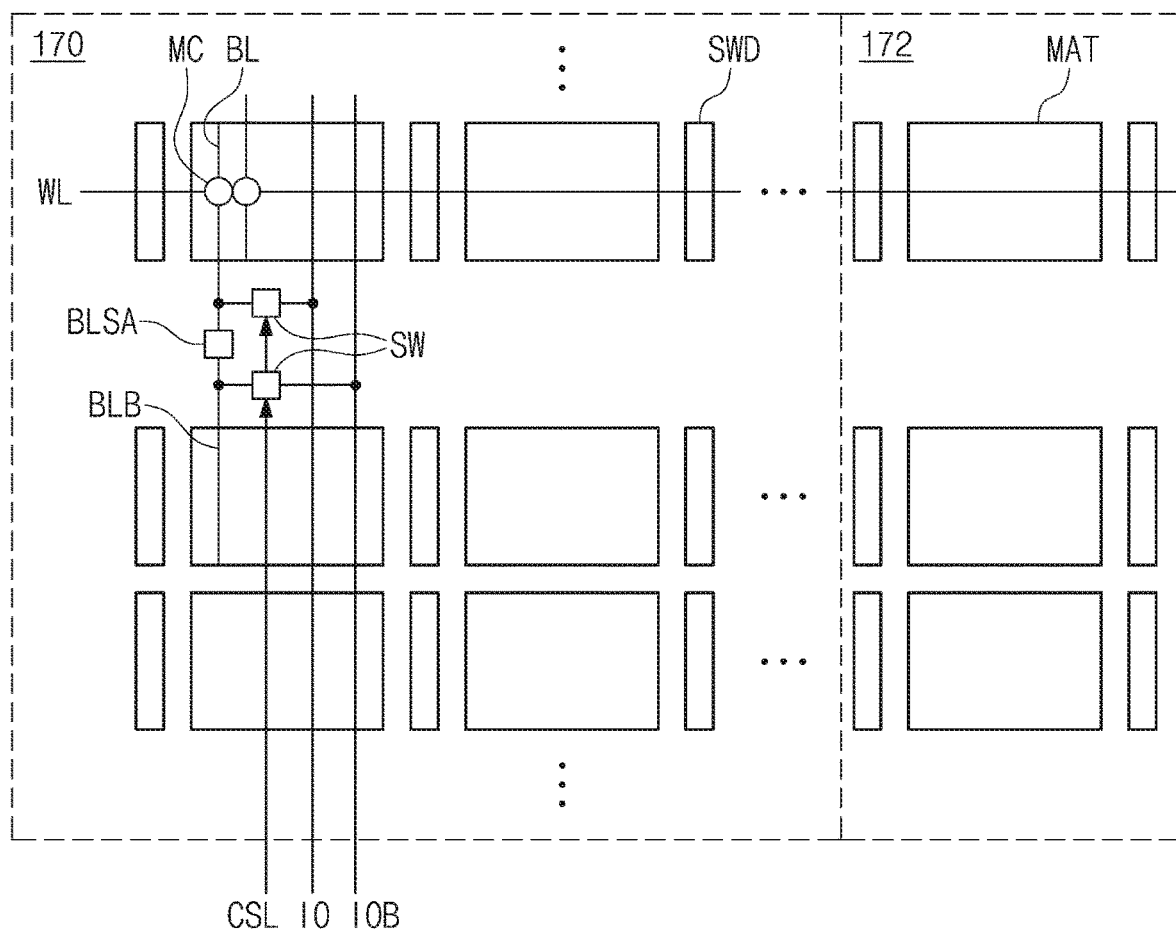
FIG. 5 is a diagram illustrating a memory cell array of FIG. 4 in detail according to some example embodiments of the inventive concepts.

FIG. 5 is a diagram illustrating a memory cell array of FIG. 4 in detail. As shown in FIG. 5, and as further shown in FIG. 4, the memory cell array 170 may include a plurality of memory cells MC. The memory cells MC of the memory cell array 170 may be divided into a plurality of mats MAT. As indicated above with reference to FIG. 4, and as further shown in FIG. 5, the memory cell array 170 may include a plurality of word lines WL and a plurality of bit lines BL connected to the plurality of memory cells MC. As further shown in FIG. 5, the memory cell array 170 may include a plurality of column selection lines CSL connected to the plurality of bit lines BL and a plurality of input/output lines IOB configured to transmit the data that is output from the ADC 152 to the plurality of memory cells MC. Word lines WL and bit lines BL connected to the memory cells MC, column selection lines CSL connected to the bit lines BL, and input/output lines IO and complementary input/output lines IOB for transmitting data to the memory cells MC or reading data from the memory cells MC may be arranged in the memory cell array 170.

A memory cell connected to a word line WL and a bit line BL may be positioned at each mat. A mat where the bit line BL is positioned and a mat where a complementary bit line BLB is positioned may be different from each other (i.e., an open bit line structure). The mats MAT may be arranged along a direction in which the word line WL extends (or a direction in which the column selection lines CSL are arranged, that is, a row direction). A sub word line driver SWD may be interposed between the mats MAT arranged along a row direction. The sub word line driver SWD may drive the word line WL of adjacent mats MAT. The mats MAT may be arranged in a direction in which the bit line BL, the complementary bit line BLB, or the column selection line CSL extends (or a direction in which the word lines WL are arranged, that is, a column direction). A bit line sense amplifier BLSA and a switch SW may be interposed between the mats MAT arranged along the column direction.

The bit line sense amplifier BLSA may sense and amplify a difference between a voltage of the bit line BL and a voltage of the complementary bit line BLB, under control of the row decoder 163 based on the activate command or the refresh command. In the case where the column decoder 164 selects the column selection line CSL based on the read command or the write command, the switches SW may be turned on or turned off according to a signal on the column selection line CSL. When the switches SW corresponding to the column address CADD are turned on, the input/output line IO and the bit line BL may be electrically connected, and the complementary input/output line IOB and the complementary bit line BLB may be electrically connected. Of course, depending on data scrambling, the complementary input/output line IOB and the bit line BL may be electrically connected, and the input/output line IO and the complementary bit line BLB may be electrically connected.

In a write operation, the input/output driver 165 may write data to the memory cell MC through the input/output line IO, the complementary input/output line IOB, the bit line BL, and the complementary bit line BLB. Any one of bits of data output from the ADC 152 may be stored to the memory cell array 170 through the input/output line IO and the complementary input/output line IOB. In a read operation, the input/output sense amplifier 166 may read data output through the bit line BL, the complementary bit line BLB, the input/output line IO, and the complementary input/output line IOB. For example, a local sense amplifier LSA which drives the input/output line IO and the complementary input/output line IOB based on the voltage difference amplified by the bit line sense amplifier BLSA may be further interposed between the mats MAT arranged along the column direction. The input/output line IO and the complementary input/output line IOB may be used for data input/output associated with the mats MAT arranged along the column direction and may be shared by the mats MAT arranged along the column direction.

In some example embodiments, the number ("quantity") of memory cells MC, the number of bit line sense amplifiers BLSA, the number of switches SW, the number of bit lines BL, the number of complementary bit lines BLB, the number of column selection lines CSL, the number of input/output lines IO, and the number of complementary input/output lines IOB are not limited to the example of FIG. 5. Also, the number of bit lines BL (or complementary bit lines BLB) selected by one column selection line CSL may be at least one or more (e.g., 4, 8, etc.). The number of input/output lines IO (or complementary input/output lines IOB) corresponding to the mats MAT arranged in the column direction may be determined according to the number of bit lines which may be selected by one column selection line CSL.

In some example embodiments, the number of memory cells MC may be determined based on the area of the first semiconductor chip 110, the area of the pixel array 140, the protocol defined in advance with an external device, etc. A range of the row address RADD and a range of the column address CADD may be determined based on the number of memory cells MC. For example, the number of memory cells MC connected to one word line WL, that is, a page size may be determined according to the range of the column address CADD.

In some example embodiments, the number of mats MAT is not limited to the example of FIG. 5. For example, data corresponding to one frame unit may be stored to the memory cell array 170 illustrated in FIG. 5. Also, the memory cell array 170 may further include any other mats, and the memory cell array 170 may be extended in the row direction or the column direction. For example, first semiconductor chip 110 may include a plurality of memory cell arrays, where the memory cell array 170 is a "first" memory cell array and the first semiconductor chip 110 further includes an extended memory cell array 172 (also referred to herein as a "second" memory cell array) that may be adjacent to the memory cell array in the first semiconductor chip 110. The extended memory cell array 172 and the memory cell array 170 may each be a DRAM cell array. Any other data corresponding to one frame unit may be further stored to the extended memory cell array 172. The command decoder 161, the address buffer 162, the row decoder 163, or the command decoder 161 may control the memory cell array 170 and the extended memory cell array 172 based on an address range in which a row address range or a column address range of the memory cell array 170 is extended, and accordingly may store data to the memory cell array 170 and/or the extended memory cell array 172.

In some example embodiments, the number ("quantity") of input/output drivers 165, the number ("quantity") of input/output sense amplifiers 166, and the number ("quantity") of pairs of input/output lines TO and complementary input/output lines IOB may be determined based on a resolution of the ADC 152, the number ("quantity") of bits of data output from the ADC 152, the HDR which the image sensor 10 supports, and the above-described numbers ("quantities") may be at least one or more. The column decoder 164 may activate at least two column selection lines CSL in parallel or at the same time ("simultaneously") based on the resolution of the ADC 152, the number of bits of data output from the ADC 152, the HDR which the image sensor 10 supports, such that data output by the ADC 152 is stored to the memory cell array 170. When at least two column selection lines CSL are activated, at least two input/output drivers 165 or at least two input/output sense amplifiers 166 may operate in parallel or at the same time. In some example embodiments, the second semiconductor chip 120 may store one or more bits of data based on a digital signal converted by the ADC 152 in parallel to the memory cell array 170 through the input/output lines IO and complementary input/output lines IOB.

Figure 6:
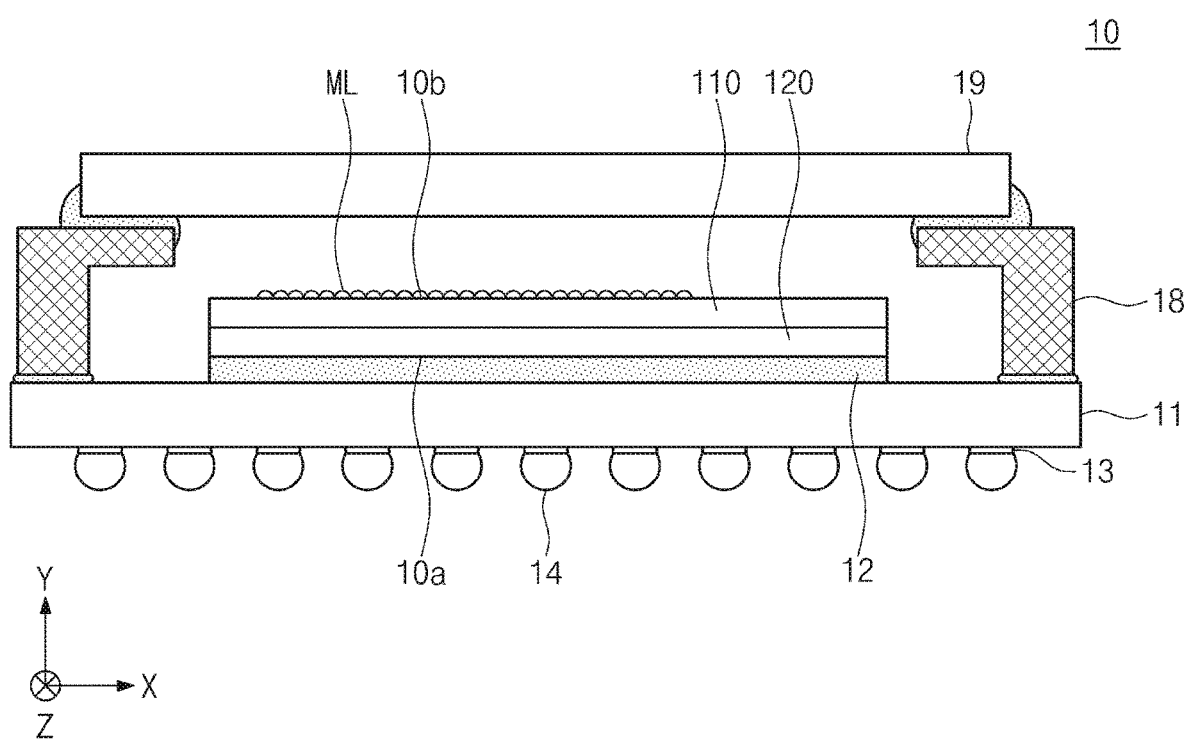
FIG. 6 is a sectional view of a package in which an image sensor of FIG. 1 is mounted according to some example embodiments of the inventive concepts.

FIG. 6 is a sectional view of a package in which an image sensor of FIG. 1 is mounted. The image sensor 10 may be mounted on a package substrate 11 by using an adhesive layer 12. For example, the package substrate 11 may be a printed circuit board (PCB). The adhesive layer 12 may be an epoxy, an insulating layer of a silicon material, or a tape. Conductive patterns may be positioned on an upper surface and a lower surface of the package substrate 11. Some of the conductive patterns may be connected to pads 13 which are provided on the lower surface of the package substrate 11. External terminals 14 for an electrical connection with an external device may be attached to the pads 13. Also, some of the conductive patterns may be connected to pads (not illustrated) which are provided on the upper surface of the package substrate 11.

For example, the external device may communicate with the first semiconductor chip 110 and the second semiconductor chip 120 through the external terminals 14, the pads 13, and the package substrate 11. The package substrate 11 may be electrically connected to the first semiconductor chip 110 and the second semiconductor chip 120 through the following scheme: a through silicon via (TSV), a back via stack (BVS), a contact of conductive patterns, or wire bonding.

The image sensor 10 may have a first surface 10a facing the package substrate 11 and a second surface 10b opposite to the first surface 10a. The image sensor 10 may include the second semiconductor chip 120 vertically stacked on the package substrate 11 and the first semiconductor chip 110 vertically stacked on the second semiconductor chip 120. For example, the first semiconductor chip 110 and the second semiconductor chip 120 may be physically and electrically combined with each other at a wafer level.

Micro lenses ML may be positioned on the second surface 10b of the image sensor 10. For example, in a top view, the micro lenses ML may be positioned to overlap the pixel array 140. In some example embodiments, the micro lenses ML may be positioned not to overlap the memory cell array 170. For another example, the micro lenses ML may be positioned to overlap the memory cell array 170 in a top view.

A holder 18 may be provided on the package substrate 11 and may surround the image sensor 10. A transparent substrate 19 may be provided on the holder 18. The transparent substrate 19 may be vertically spaced from the image sensor 10. For example, the first semiconductor chip 110 may be positioned closer to the transparent substrate 19 than the package substrate 11, and the second semiconductor chip 120 may be positioned closer to the package substrate 11 than the transparent substrate 19.

In some example embodiments, the image sensor 10 may be mounted by using various kinds of semiconductor packages. For example, the image sensor 10 may be mounted by using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), metric quad flat pack (MQFP), thin quad flat pack (TQFP), small outline integrated circuit (SOIC), shrink small outline package (SSOP), thin small outline package (TSOP), system in package (SIP), multi-chip package (MCP), wafer-level fabricated package (WFP), and wafer-level processed stack package (WSP), etc.

Figure 7:
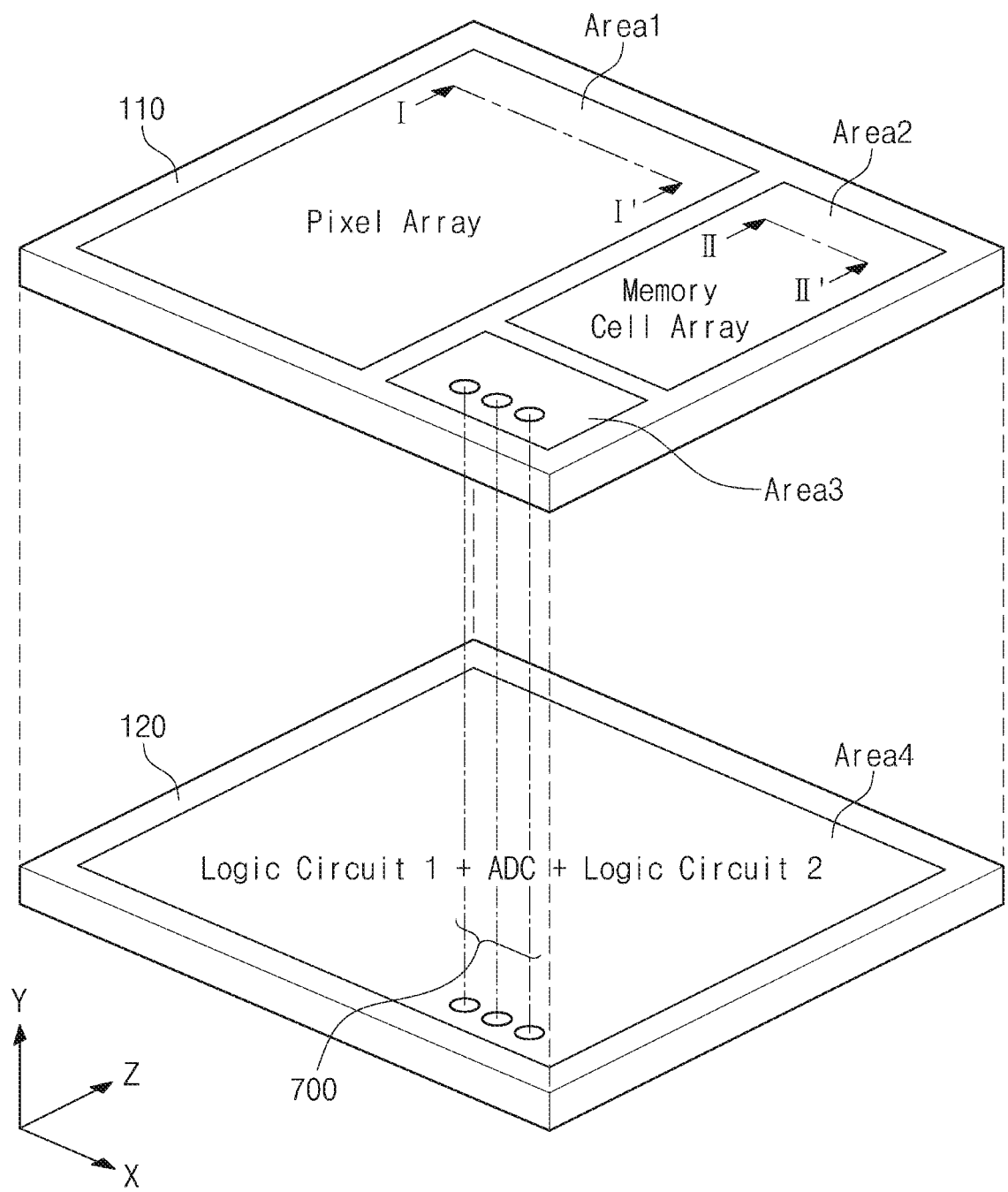
FIG. 7 is a diagram illustrating how a pixel array, a memory cell array, a first logic circuit, an ADC, and a second logic circuit of an image sensor of FIG. 1 are positioned according to some example embodiments of the inventive concepts.

FIG. 7 is a diagram illustrating how a pixel array, a memory cell array, a first logic circuit, an ADC, and a second logic circuit of an image sensor of FIG. 1 are positioned. The first semiconductor chip 110 and the second semiconductor chip 120 of the image sensor 10 may be vertically stacked each other. An example is illustrated in FIG. 7 as the size of the first semiconductor chip 110 is identical to the size of the second semiconductor chip 120, but the first semiconductor chip 110 and the second semiconductor chip 120 may be different in the size. As described above, the pixel array 140 and the memory cell array 170 may be positioned in the first semiconductor chip 110. The first logic circuit 150, the ADC 152, and the second logic circuit 160 may be positioned in the second semiconductor chip 120. Of course, some of components of the second logic circuit 160 may be positioned in the first semiconductor chip 110.

As shown in at least FIG. 7, the pixel array 140 may be positioned in a first area ("Area1") of the first semiconductor chip 110, and the memory cell array 170 may be positioned in a second area ("Area2") of the first semiconductor chip 110, where the second area is separate from the first area. Accordingly, the elements included in the memory cell array 170 as described herein may be further understood to be included in the second area. The first area and the second area may be mutually exclusive separate areas of the first semiconductor chip 110. The first area and the second area, in addition to being separate areas of the first semiconductor chip 110, may be different in size and/or shape from each other. The first area may be larger than the second area. Some of the components of the second logic circuit 160 or paths 700 (e.g., "conductive patterns") electrically connecting the first semiconductor chip 110 to the second semiconductor chip 120 may be positioned in a third area ("Area 3") separated from the first area and the second area. For example, the paths 181 and 182 of FIG. 1 may be positioned between the first or the third areas of the first semiconductor chip 110, and the second semiconductor chip 120. At least one or all of the paths 181 and 182 of FIG. 1 may be included in the paths 700. The paths 183 of FIG. 1 may be positioned between the second or the third areas of the first semiconductor chip 110, and the second semiconductor chip 120. At least one or all of the paths 183 of FIG. 1 may be included in the paths 700. The third area may be smaller than the second area. The third area may be separate from the first and second areas. The third area and the first and second areas may be mutually exclusive separate areas of the first semiconductor chip 110. The paths 700 electrically connecting the first semiconductor chip 110 to the second semiconductor chip 120 may be formed between the third area of the first semiconductor chip 110 and an area of the second semiconductor chip 120 overlapping the third area in a top view (e.g., overlapping the third area in the vertical direction. For example, a signal(s) which the second logic circuit 160 uses to control the memory cell array 170 or data output from the ADC 152 based on a digital signal generated at the ADC 152 based on conversion of an analog signal that is output from the pixel array 140 under control of the first logic circuit 150 may be transmitted from the second semiconductor chip 120 to the first semiconductor chip 110 through the above-described paths 700. Accordingly, the image sensor 10 may be configured to enable the data to be transmitted from the second semiconductor chip 120 to the first semiconductor chip 110 through one or more paths 700 ("conductive lines"). While the embodiments of FIG. 7 are described with reference to a plurality of paths 700, it will be understood that in some example embodiments a single path ("conductive line") may be present connecting the third area of the first semiconductor chip 110 and the area of the second semiconductor chip 120.

In some example embodiments, pads (not illustrated) may be further positioned at the edge of the first semiconductor chip 110. Paths 700 electrically connecting the first semiconductor chip 110 and the second semiconductor chip 120 may be further interposed between an area where the pads positioned at the edge are placed and an area, which overlaps the above-described area in a top view, of the second semiconductor chip 120.

The first logic circuit 150, the ADC 152, and the second logic circuit 160 may be positioned in a fourth area of the second semiconductor chip 120. The fourth area may indicate the whole area of the second semiconductor chip 120. For example, the first logic circuit 150 and the ADC 152 may be positioned in an area, which overlaps the first area of the first semiconductor chip 110 in a top view, of the fourth area. The second logic circuit 160 may be positioned in an area, which overlaps the second area and the third area of the first semiconductor chip 110 in a top view, of the fourth area. Of course, some of components of the first logic circuit 150 and the ADC 152 may be positioned in an area, which overlaps the second area and the third area of the first semiconductor chip 110 in a top view, of the fourth area. Some of the components of the second logic circuit 160 may be positioned in an area, which overlaps the first area of the first semiconductor chip 110 in a top view, of the fourth area.

Figure 8:
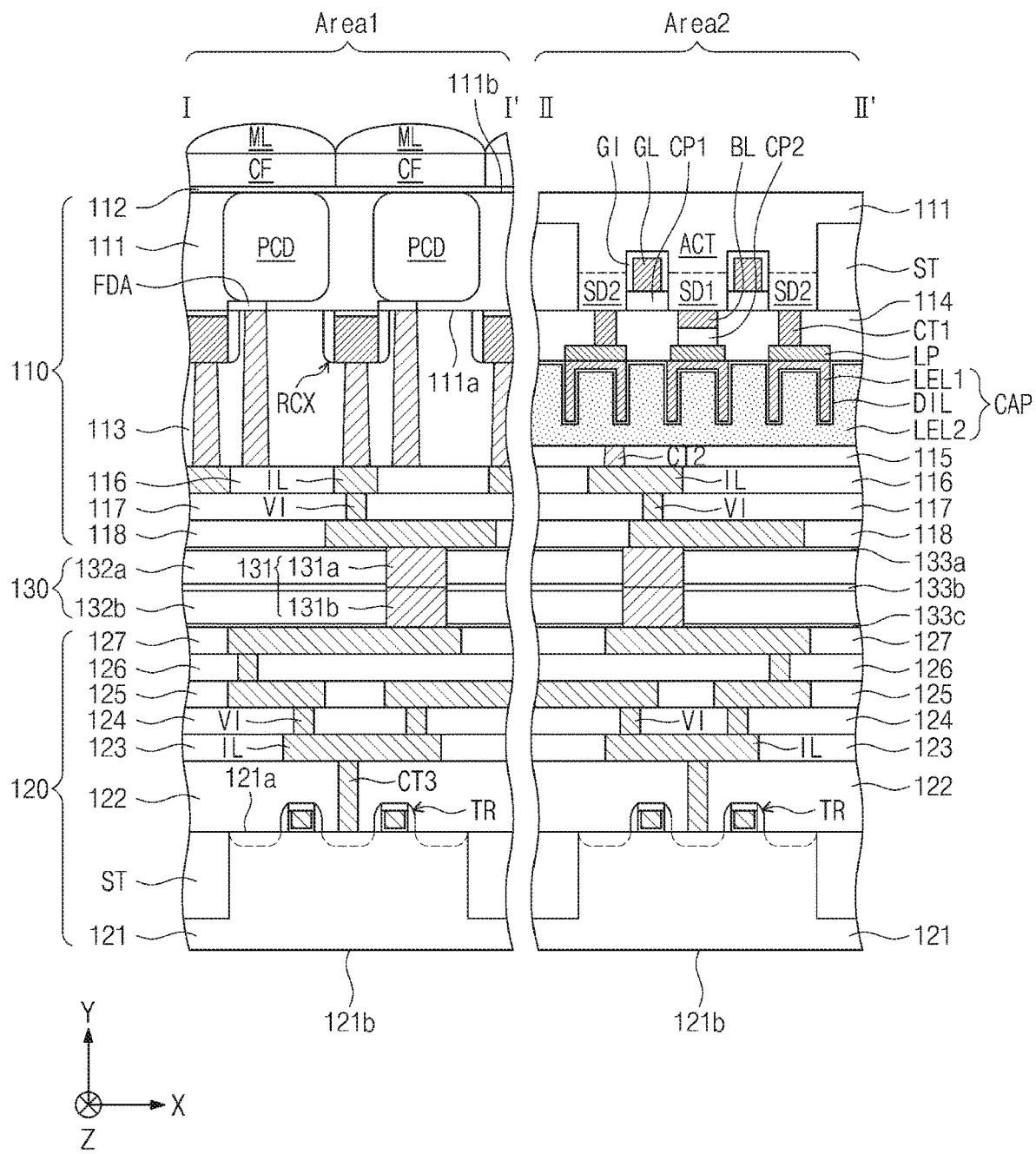
FIG. 8 is a sectional view of an image sensor taken along a line I-I' and a line II-II' of FIG. 7 according to some example embodiments of the inventive concepts.

FIG. 8 is a sectional view of an image sensor taken along a line I-I' and a line II-II' of FIG. 7. The image sensor 10 may include the first semiconductor chip 110, the second semiconductor chip 120, and an insertion layer 130. The first semiconductor chip 110 may be vertically stacked on the second semiconductor chip 120 by using the insertion layer 130. The insertion layer 130 may be interposed between the first semiconductor chip 110 and the second semiconductor chip 120.

The first semiconductor chip 110 may include a first area and a second area separated from each other. The pixel array 140 including pixels may be positioned in the first area. The memory cell array 170 including memory cells (e.g., DRAM cells) may be positioned in the second area. First, a description will be given with regard to the first area of the first semiconductor chip 110.

The first semiconductor chip 110 may include a first substrate 111, photoelectric conversion devices PCD formed at the first substrate 111, floating diffusion areas FDA, and readout circuit devices RCX. The first substrate 111 may be a p-type semiconductor substrate (e.g., a silicon substrate, a germanium substrate, or a silicon-germanium substrate) doped with impurities. The first substrate 111 may include a first surface 111a and a second surface 111b opposite to each other. The second surface 111b may be the second surface 10b described with reference to FIG. 6.

The readout circuit devices RCX may be positioned on the first surface 111a of the first substrate 111. The readout circuit devices RCX may include transistors (e.g., the transmission transistor TX, the reset transistor RX, the drive transistor DX, and the selection transistor SX of FIG. 3) transmitting or amplifying an electrical signal (e.g., a photo charge) corresponding to an incident light.

Each of the photoelectric conversion devices PCD may include a photo diode. The photoelectric conversion devices PCD may be formed in the first substrate 111. The photoelectric conversion devices PCD may generate photocharges corresponding to an incident light. For example, electron-hole pairs based on the incident light may be generated at each photoelectric conversion device PCD. The photoelectric conversion devices PCD may be doped with an impurity to have a different conductive type (e.g., n-type) from the first substrate 111.

Color filters CF and the micro lenses ML may be positioned on the second surface 111b of the first substrate 111 for providing the incident light to the photoelectric conversion devices PCD. The color filters CF may be positioned on the photoelectric conversion devices PCD, respectively. The color filters CF may be arranged in a matrix form to configure a color filter array. For example, the color filter array may include a Bayer pattern composed of a red filter, a green filter, and a blue filter. Each of the color filters CF may be one of the red filter, the green filter, and the blue filter. For another example, the color filter array may include a Bayer pattern composed of a yellow filter, a magenta filter, and a cyan filter. Each of the color filters CF may be one of the yellow filter, the magenta filter, and the cyan filter.

The micro lenses ML may be positioned on the color filters CF, respectively. Each of the micro lenses ML may adjust a path of an incident light so that a light incident thereto is focused on the corresponding photoelectric conversion device PCD. The micro lenses ML may be arranged in a matrix form to configure a micro lens array.

An anti-reflection layer 112 may be interposed between the second surface 111b of the first substrate 111 and the color filters CF. The anti-reflection layer 112 may prevent the incident light from being reflected from the second surface 111b of the first substrate 111. For example, the anti-reflection layer 112 may have a multi-layer structure in which materials of different reflective indexes are stacked alternately. The permittivity of the anti-reflection layer 112 may be improved as the number of stacked materials of different reflective indexes increases.

Upper insulating layers 113, 116, 117, and 118 may be stacked on the first surface 111a of the first substrate 111. The number of upper insulating layers is not limited to the example of FIG. 8. The upper insulating layers 113, 116, 117, and 118 may include a silicon oxide material. Wiring lines IL and vias VI may be provided in the upper insulating layers 113, 116, 117, and 118. The vias VI may vertically connect the wiring lines IL. For example, the wiring lines IL of the first semiconductor chip 110 may be electrically connected to the readout circuit devices RCX.

The photoelectric conversion devices PCD of the first semiconductor chip 110 may generate photo charges in response to an incident light passing through the second surface 111b of the first substrate 111. That is, the image sensor 10 according to some example embodiments of the inventive concepts may be a backside illuminated image sensor (BIS). Below, a description will be given with regard to the second area of the first semiconductor chip 110. Both the first area and the second area may be formed by using the same substrate, that is, the first substrate 111.

A device isolation layer ST defining active areas ACT may be provided in the second area of the first semiconductor chip 110. For example, the device isolation layer ST may include a silicon oxide layer, a silicon nitride layer, or a silicon oxide nitride layer. The device isolation layer ST may separate the active areas ACT. Also, the device isolation layer ST may be formed between the first area and the second area and may separate the first area and the second area.

Gate lines GL crossing the active areas ACT may be provided in the first substrate 111. The gate lines GL may be buried in the first substrate 111. The gate lines GL may include a conductive material. For example, the conductive material may be any one of a doped semiconductor material (e.g., doped silicon or doped germanium), a conductive metal nitride material (e.g., titanium nitride or tantalum nitride), a metal material (e.g., tungsten, titanium, or tantalum), and a metal-semiconductor compound (e.g., tungsten silicide, cobalt silicide, or titanium silicide). A gate insulating pattern GI may be provided between each gate line GL and the active area ACT. For example, the gate insulating pattern GI may include a silicon oxide layer, a silicon nitride layer, or a silicon oxide nitride layer.

A first capping pattern CP1 may be provided on an upper surface of each gate line GL. The upper surface of the first capping pattern CP1 may be in substantially the same plane (e.g., the same plane within manufacturing tolerances and/or material tolerances) as the first surface 111a of the first substrate 111. For example, the first capping pattern CP1 may include a silicon nitride layer or a silicon oxide nitride layer.

A first impurity area SD1 and a pair of second impurity areas SD2 may be provided in each active area ACT. The pair of second impurity areas SD2 may be spaced from each other with respect to the first impurity area SD1. The first impurity area SD1 may be provided in the active area ACT between a pair of gate lines GL adjacent to each other. The second impurity areas SD2 may be positioned in the active area ACT and on opposite sides of the pair of gate lines GL. The second impurity areas SD2 may be spaced from each other with respect to the pair of gate lines GL. A conductive type of the first impurity area SD1 may be substantially identical (e.g., identical within manufacturing tolerances and/or material tolerances) to a conductive type of the second impurity area SD2.

An upper insulating layer 114 covering the active areas ACT may be provided on the first surface 111a of the first substrate 111. The upper insulating layer 114 may include a silicon oxide layer or a silicon oxide nitride layer.

Bit lines BL may be provided in the upper insulating layer 114. Each of the bit lines BL may be electrically connected to the first impurity area SD1. For example, the bit lines BL may include any one of a doped semiconductor material, a conductive metal nitride material, a metal material, and a metal-oxide compound. A second capping pattern CP2 may be provided on an upper surface of each bit line BL. For example, the second capping pattern CP2 may include a silicon nitride layer or a silicon oxide nitride layer.

First contacts CT1 and landing pads LP may be provided in the upper insulating layer 114. Each of the landing pads LP may be positioned on the corresponding one of the first contacts CT1. The first contacts CT1 may be electrically connected to the second impurity areas SD2. The first contacts CT1 and the landing pads LP may include a conductive material such as a doped silicon material or a metal material.

At least one capacitor CAP may be positioned on the upper insulating layer 114. The capacitor CAP may include a first electrode LEL1, a second electrode LEL2, and a dielectric layer DIL interposed between the first electrode LEL1 and the second electrode LEL2. The first electrodes LEL1 may be positioned on the landing pads LP, respectively. Each of the first electrodes LEL1 may be electrically connected to the second impurity area SD2 through the landing pad LP and the first contact CT1. In a top view, the first electrodes LEL1 may be arranged in a zig zag form or in a row.

Each of the first electrodes LEL1 may be implemented in the form of a cylinder (or cup) having a bottom and a side wall vertically extended from the bottom. The bottom and the side wall of each of the first electrodes LEL1 may have substantially the same thickness (e.g., the same thickness within manufacturing tolerances and/or material tolerances). Flat diameters of the first electrodes LEL1 may have substantially identical (e.g., identical within manufacturing tolerances and/or material tolerances) to each other.

The first electrodes LEL1 may include any one of a doped semiconductor material, a conductive metal nitride material, a metal material, and a metal-oxide compound. For example, the first electrodes LEL1 may include a metal nitride layer such as a titanium nitride (TiN) layer, a titanium silicon nitride (TiSiN) layer, a titanium aluminum nitride (TiAlN) layer, a tantalum nitride (TaN) layer, a tantalum silicon nitride (TaSiN) layer, a tantalum aluminum nitride (TaAlN) layer, and a tungsten nitride (WN) layer.

The dielectric layer DIL may be provided on surfaces of the first electrodes LEL1 with a uniform thickness. For example, the dielectric layer DIL may include a high-k material such as $HfO_2$, $ZrO_2$, $Al_2O_3$, $La_2O_3$, $Ta_2O_3$, or $TiO_2$.

The second electrode LEL2 may be provided on the dielectric layer DIL. The second electrode LEL2 may cover the plurality of first electrodes LEL1, with the dielectric layer DIL interposed therebetween. A portion of the second electrode LEL2 may fill the interior of the first electrode LEL1 of the cylinder form (or the cup form). The second electrodes LEL2 may include any one of a doped semiconductor material, a conductive metal nitride material, a metal material, and a metal-oxide compound. For example, the second electrode LEL2 may have a structure in which a metal nitride layer and a semiconductor layer are sequentially stacked.

Upper insulating layers 115, 116, 117, and 118 may be stacked on the capacitor CAP. At least one second contact CT2 which is electrically connected to the second electrode LEL2 through the upper insulating layer 115 may be provided. Wiring lines IL and vias VI may be provided in the upper insulating layers 116, 117, and 118. The vias VI may vertically connect the wiring lines IL. For example, the wiring lines IL may be electrically connected to the capacitor CAP through the second contact CT2.

Unlike the first region, the anti-reflection layer 112, the color filters CF, and the micro lenses ML may not be provided on the second surface 111b of the first substrate 111 corresponding to the second area. Below, a description will be given with regard to the second semiconductor chip 120.

The second semiconductor chip 120 may include a second substrate 121 and transistors TR formed on the second substrate 121. The second substrate 121 may be a p-type semiconductor substrate (e.g., a silicon substrate, a germanium substrate, or a silicon-germanium substrate) doped with impurities. The second substrate 121 may include a first surface 121a and a second surface 121b opposite to each other. The second surface 121b may be the first surface 10a described with reference to FIG. 6. The first surface 121a of the second substrate 121 and the first surface 111a of the first substrate 111 may face each other.

Transistors TR (or logic cells) formed on the second substrate 121 may configure the first logic circuit 150, the ADC 152, and the second logic circuit 160, which are described above. Each of the transistors TR may include a gate electrode and impurity areas positioned on opposite sides of the gate electrode. The impurity areas may be areas of the second substrate 121, which are doped with an impurity. Device isolation layers ST may be provided adjacent to the transistors TR.

Lower insulating layers 122, 123, 124, 125, 126, and 127 may be stacked on the first surface 121a of the second substrate 121. The number of lower insulating layers is not limited to the example of FIG. 8. The lower insulating layers 122, 123, 124, 125, 126, and 127 may include a silicon oxide material. The lower insulating layer 122 may cover the transistors TR. At least one third contact CT3 may be connected to any one of the impurity areas of the transistors TR through the lower insulating layer 122. Wiring lines IL and vias VI may be provided in the lower insulating layers 122, 123, 124, 125, 126, and 127. The vias VI may vertically connect the wiring lines IL. For example, the wiring lines IL of the second semiconductor chip 120 may be electrically connected to the transistors TR.

The insertion layer 130 may physically and electrically connect the first semiconductor chip 110 to the second semiconductor chip 120. The insertion layer 130 may include a connection part 131. The connection part 131 may electrically connect the wiring lines IL of the first semiconductor chip 110 to the wiring lines IL of the second semiconductor chip 120. The connection part 131 may be implemented by using a contact of conductive patterns, such as copper or tungsten, TSV, BVS, etc. In detail, the connection part 131 may include a first conductive pattern 131a electrically connected to at least one wiring line IL of the first semiconductor chip 110 and a second conductive pattern 131b electrically connected to at least one wiring line IL of the second semiconductor chip 120. The first conductive pattern 131a and the second conductive pattern 131b may be in direct contact with each other so as to be electrically connected. The connection part 131, the wiring lines IL, and the vias VI may at least partially comprise a path 700-1 to 700-N of the paths 700.

The insertion layer 130 may further include a first insulating layer 132a and a second insulating layer 132b. The first conductive pattern 131a and the second conductive pattern 131b may be respectively provided in the first insulating layer 132a and the second insulating layer 132b. For example, the first insulating layer 132a and the second insulating layer 132b may include a silicon oxide layer.

The insertion layer 130 may further include a first metal diffusion barrier layer 133a, a second metal diffusion barrier layer 133b, and a third metal diffusion barrier layer 133c. The first metal diffusion barrier layer 133a may be interposed between the first semiconductor chip 110 and the first insulating layer 132a, the second metal diffusion barrier layer 133b may be interposed between the first insulating layer 132a and the second insulating layer 132b, and the third metal diffusion barrier layer 133c may be interposed between the second insulating layer 132b and the second semiconductor chip 120. The first to third metal diffusion barrier layers 133a to 133c may include SiN, SiCN, SiOCN, SiON, or SiC. The first to third metal diffusion barrier layers 133a to 133c may prevent metallic diffusion from the connection part 131.

The at least one connection part 131 may correspond to at least one path electrically connecting the first semiconductor chip 110 to the second semiconductor chip 120. For example, an analog signal generated by the pixel array 140 may be provided to the ADC 152 through the connection part 131. Data may be provided to the memory cell array 170 through the connection part 131. Also, signals for controlling the memory cell array 170 and voltages for driving the memory cell array 170 may be provided to the memory cell array 170 through the connection part 131. The above-described paths may be implemented or formed independently so as to be separated from each other.

Figure 9:
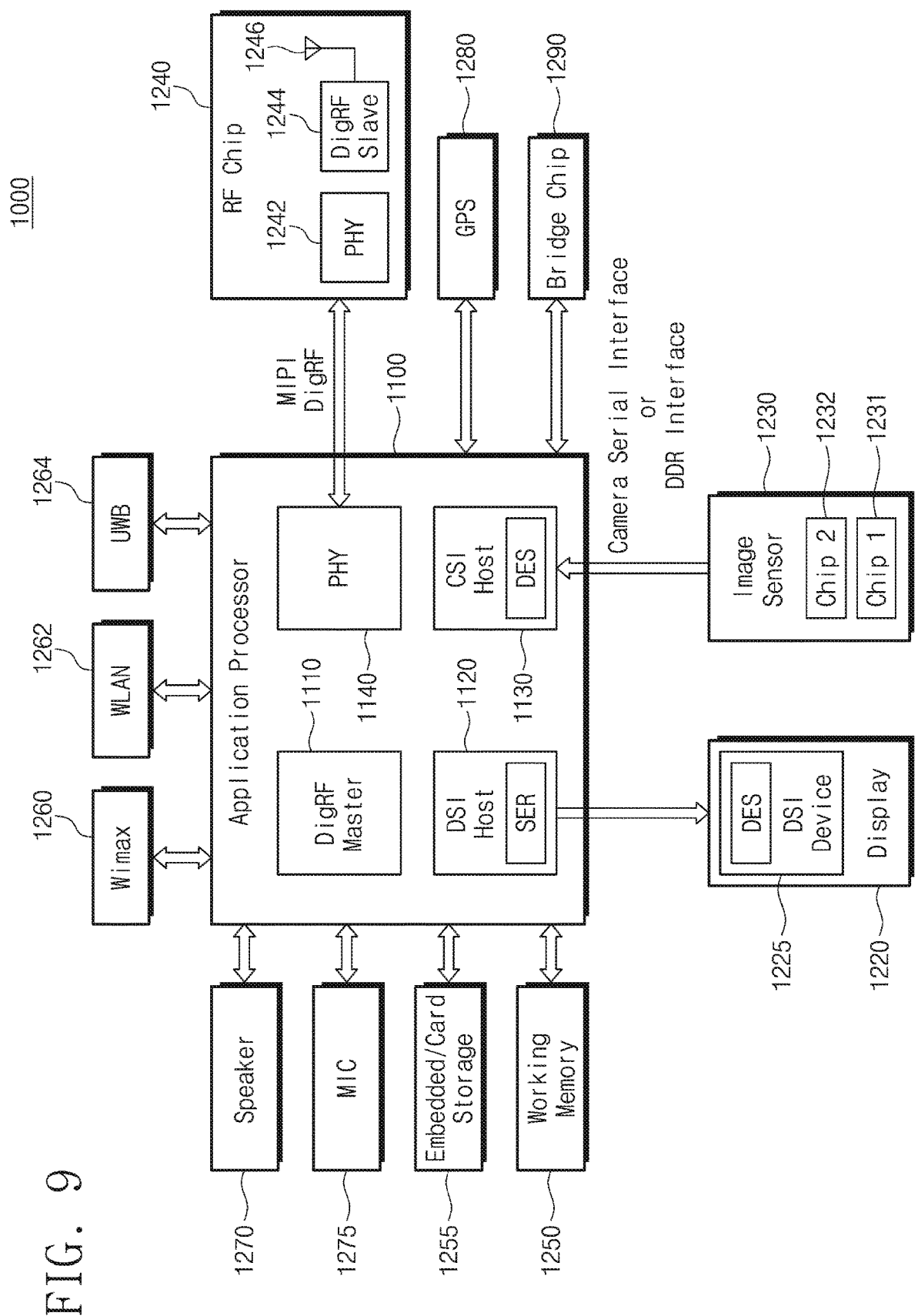
FIG. 9 is a block diagram illustrating a configuration of an electronic device including an image sensor according to some example embodiments of the inventive concepts and interfaces thereof.

FIG. 9 is a block diagram illustrating a configuration of an electronic device including an image sensor according to some example embodiments of the inventive concepts and interfaces thereof. An electronic device 1000 may be implemented with an electronic device that may use or support interfaces proposed by mobile industry processor interface (MIPI) alliance. For example, the electronic device 1000 may be a mobile device, a personal digital assistant (PDA), a portable multimedia player (PMP), a smartphone, or a wearable device.

The electronic device 1000 may include an application processor 1100, a display 1220, and an image sensor 1230 according to some example embodiments of the inventive concepts. The application processor 1100 may include a DigRF master 1110, a display serial interface (DSI) host 1120, a camera serial interface (CSI) host 1130, and a physical layer 1140.

The DSI host 1120 may communicate with a DSI device 1225 of the display 1220 in compliance with the DSI. For example, an optical serializer SER may be implemented in the DSI host 1120. For example, an optical deserializer DES may be implemented in the DSI device 1225.

The CSI host 1130 may communicate with a second semiconductor chip 1232 of the image sensor 1230 according to some example embodiments of the inventive concepts, in compliance with the CSI. For example, an optical deserializer DES may be implemented in the CSI host 1130. For example, an optical serializer SER may be implemented in the second semiconductor chip 1232. Also, as described above, the pixel array 140 and the memory cell array 170 may be implemented in a first semiconductor chip 1231. The first logic circuit 150, the ADC 152, and the second logic circuit 160, which are used to control the pixel array 140 and the memory cell array 170, may be implemented in the first semiconductor chip 1231. The CSI host 1130 of the application processor 1100 may receive and process output data from the image sensor 1230. The second semiconductor chip 1232 may be configured to provide image data, that is not yet stored to the memory cell array 170, to the CSI host 1130 as output data in response to a first request of the CSI host or to provide image data already stored to the memory cell array 170 to the CSI host 1130 as the output data in response to a second request of the CSI host 1130. The second semiconductor chip 1232 may be configured to provide the output data to the CSI host 1130 based on a double data rate (DDR) interface in response to the second request of the CSI host 1130.

The electronic device 1000 may further include a radio frequency (RF) chip 1240 which communicates with the application processor 1100. The RF chip 1240 may include a physical layer 1242, a DigRF slave 1244, and an antenna 1246. For example, the physical layer 1242 of the RF chip 1240 and the physical layer 1140 of the application processor 1100 may exchange data with each other in compliance with the DigRF interface supported by the MIPI alliance.

The electronic device 1000 may further include a working memory 1250 and an embedded/card storage device 1255. The working memory 1250 and the embedded/card storage 1255 may store data received from the application processor 1100. The working memory 1250 may temporarily store data processed or to be processed by the application processor 1100. The embedded/card storage 1255 may store data regardless of a power supply. The working memory 1250 and the embedded/card storage 1255 may provide the data stored therein to the application processor 1100.

The electronic device 1000 may communicate with an external system through worldwide interoperability for microwave access (WiMAX) 1260, a wireless local area network (WLAN) 1262, ultra wide band (UWB) 1264, etc. The electronic device 1000 may further include a speaker 1270 and a microphone 1275, which are used to process voice information. The electronic device 1000 may further include a global positioning system (GPS) device 1280 for processing position information. The electronic device 1000 may further include a bridge chip 1290 for managing connection with peripheral devices.

Figure 10:
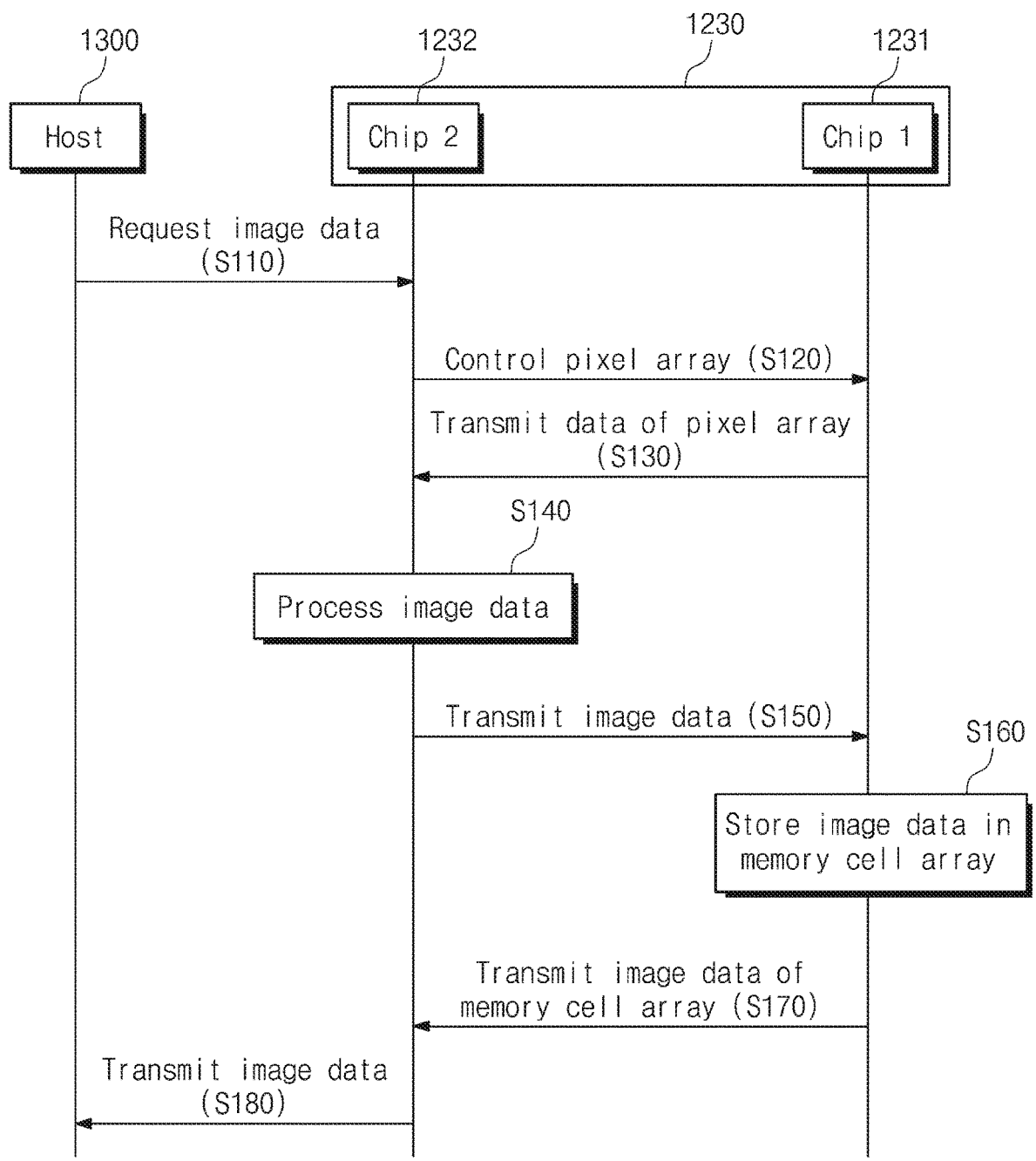
FIG. 10 is a flowchart illustrating an operating method of an electronic device including an image sensor according to some example embodiments of the inventive concepts.

FIG. 10 is a flowchart illustrating an operating method of an electronic device including an image sensor according to some example embodiments of the inventive concepts. FIG. 10 will be described with reference to FIG. 9. Referring to FIG. 10, the host 1300 (e.g., the application processor 1100 or the CSI host 1130 of FIG. 9) and the image sensor 1230 including the first semiconductor chip 1231 and the second semiconductor chip 1232 is illustrated as an example.

In operation S110, the host 1300 may request image data from the second semiconductor chip 1232 of the image sensor 1230. The request of the host 1300 may be a write command or a read command defined in compliance with the CSI or DDR interface.

In operation S120, a first logic circuit (refer to 150) of the second semiconductor chip 1232 may control or drive a pixel array (refer to 140) of the first semiconductor chip 1231. In operation S130, data (e.g., an analog signal) output from the pixel array of the first semiconductor chip 1231 may be transmitted to an ADC (refer to 152) of the second semiconductor chip 1232.

In operation S140, the first logic circuit and the ADC of the second semiconductor chip 1232 may process the data transmitted in operation S130. The ADC may convert the analog signal to a digital signal. The first logic circuit and the ADC of the second semiconductor chip 1232 may provide the processed data to a second logic circuit (refer to 160). Further, the first logic circuit and the ADC of the second semiconductor chip 1232 may provide the processed data to the host 1300. In operation S150, the second logic circuit may transmit the data processed in operation S140 to a memory cell array (refer to 170) of the first semiconductor chip 1231. Also, although not illustrated in FIG. 10, the second logic circuit may transmit the data processed in operation S140 to the host 1300, as well as to the memory cell array.

In operation S160, the data transmitted in operation S150 may be stored to the memory cell array. For example, in the case where the host request of operation S110 is a read command, in operation S170, the data stored in the memory cell array may be transmitted to the second logic circuit of the second semiconductor chip 1232. For another example, in the case where the host request of operation S110 is a write command and a read command is issued by the host 1300 after operation S110, in operation S170, the data stored in the memory cell array may be transmitted to the second logic circuit of the second semiconductor chip 1232. In operation S180, the second logic circuit of the second semiconductor chip 1232 may transmit or provide the data transmitted in operation S170 to the host 1300 in compliance with the CSI or DDR interface.

In some example embodiments, the data generated from the pixel array of the first semiconductor chip 1231 may be stored to the memory cell array of the first semiconductor chip 1231 depending on the host request of operation S110. Accordingly, the memory cell array 170 may operate as a cache memory or a buffer memory of the host 1300. At operation S180, the second semiconductor chip 1232 may transmit image data, that is not yet stored to the memory cell array 170, to the host 1300 as output data in response to a first request of the host 1300, or the second semiconductor chip 1232 may provide image data already stored to the memory cell array 170 to the host 1300 as the output data in response to a second request of the host 1300. The second semiconductor chip 1232 may be configured to provide the output data to the host 1300 based on a double data rate (DDR) interface in response to the second request of the host 1300.

According to some example embodiments of the inventive concepts, a pixel array and a memory cell array of an image sensor may be merged in an image sensor chip. Also, a logic circuit for controlling the pixel array and a logic circuit for controlling the memory cell array may be merged in one logic chip. Accordingly, the logic chip may not include paths and circuits for transmitting data generated by the pixel array to any other memory chip or any other logic chip. This may mean that the area and power consumption of the image sensor are improved.

While the inventive concepts has been described with reference to example embodiments thereof, it will be apparent to those of ordinary skill in the art that various changes and modifications may be made thereto without departing from the spirit and scope of the inventive concepts as set forth in the following claims.

What is claimed is:

1. An image sensor in which a pixel array and a memory cell array are merged, the image sensor comprising:
   a first semiconductor chip including the pixel array and the memory cell array in a same semiconductor chip; and
   a second semiconductor chip overlapping the first semiconductor chip in a vertical direction, the second semiconductor chip including
      a first logic circuit configured to control the pixel array,
      an analog-to-digital converter (ADC) circuit configured to convert an analog signal that is output from the pixel array under control of the first logic circuit to a digital signal, and
      a second logic circuit configured to store data that is output from the ADC circuit based on the digital signal to the memory cell array,
   wherein the pixel array is in a first area of the first semiconductor chip, the memory cell array is in a second area of the first semiconductor chip, and the second area is separate from the first area,
   wherein the image sensor further includes a conductive line between a third area of the first semiconductor chip and an area of the second semiconductor chip that overlaps the third area in the vertical direction, the third area being separate from the first and second areas and electrically connecting the first semiconductor chip and the second semiconductor chip,
   wherein the image sensor is configured to enable the data to be transmitted from the second semiconductor chip to the first semiconductor chip through the conductive line.

2. The image sensor of claim 1, wherein
   the memory cell array includes a plurality of memory cells, and
   the second area of the first semiconductor chip includes
      a plurality of word lines and a plurality of bit lines connected to the plurality of memory cells,
      a plurality of column selection lines connected to the plurality of bit lines, and
      a plurality of input/output lines configured to transmit the data to the plurality of memory cells.

3. The image sensor of claim 2, wherein
   a quantity of the plurality of input/output lines is based on a quantity of bits of the data, and
   the quantity of the bits of the data is based on a high dynamic range (HDR) supported by the image sensor.

4. The image sensor of claim 2, further comprising:
   one or more driver circuits configured to drive the plurality of input/output lines depending on the data, the one or more driver circuits being in the first semiconductor chip or the second semiconductor chip.

5. The image sensor of claim 2, further comprising:
   a row decoder circuit configured to select at least one word line of the plurality of word lines; and
   a column decoder circuit configured to select at least one column selection line of the plurality of column selection lines,
   wherein each decoder circuit of the row decoder circuit and the column decoder circuit is in the first semiconductor chip or the second semiconductor chip.

6. The image sensor of claim 5, wherein
   each memory cell of the plurality of memory cells includes a dynamic random access memory (DRAM) cell, and the row decoder circuit is configured to refresh one or more memory cells of the plurality of memory cells by activating one or more word lines of the plurality of word lines.

7. The image sensor of claim 5, wherein the column decoder circuit is configured to simultaneously activate at least two column selection lines of the plurality of column selection lines to store the data to the memory cell array.

8. An image sensor, comprising:
a first semiconductor chip including a pixel array and a dynamic random access memory (DRAM) cell array in a same semiconductor chip; and
a second semiconductor chip overlapping the first semiconductor chip in a vertical direction, the second semiconductor chip configured to control the pixel array and the DRAM cell array,
wherein the second semiconductor chip is configured to
receive an analog signal output from the pixel array through a first path between the first semiconductor chip and the second semiconductor chip,
convert the analog signal to a digital signal, and
transmit data that is based on the digital signal to the DRAM cell array of the first semiconductor chip through a second path between the first semiconductor chip and the second semiconductor chip.

9. The image sensor of claim 8, wherein each path of the first path and the second path includes a contact of conductive patterns, a through silicon via (TSV), or a back via stack (BVS).

10. The image sensor of claim 8, wherein
the DRAM cell array is a first DRAM cell array,
a second DRAM cell array is adjacent to the first DRAM cell array in the first semiconductor chip, and
the second semiconductor chip is configured to store the data to the first DRAM cell array or the second DRAM cell array based on an address range in which a row address range or a column address range of the first DRAM cell array is extended.

11. The image sensor of claim 8, wherein
the second semiconductor chip includes a voltage generator configured to generate a voltage to drive the DRAM cell array, and
the voltage generator provides the voltage to the DRAM cell array through a third path formed between the first semiconductor chip and the second semiconductor chip.

12. The image sensor of claim 8, wherein the second semiconductor chip includes an analog-to-digital converter (ADC) circuit configured to convert the analog signal to the digital signal, the digital signal having one or more bits.

13. The image sensor of claim 12, wherein
a plurality of input/output lines through which the one or more bits of the digital signal are transmitted, the plurality of input/output lines being in the DRAM cell array, and
the second semiconductor chip stores the bits in parallel to the DRAM cell array through the plurality of input/output lines.

14. An electronic device, comprising:
an image sensor including a first semiconductor chip and a second semiconductor chip, the second semiconductor chip overlapping the first semiconductor chip in a vertical direction; and
a host configured to receive and process output data output from the image sensor,
wherein the first semiconductor chip includes a pixel array and a memory cell array in a same semiconductor chip,
wherein the second semiconductor chip is configured to convert an analog signal output from the pixel array to a digital signal and store image data based on the digital signal to the memory cell array of the first semiconductor chip,
wherein the second semiconductor chip is configured to
provide the image data, which are not yet stored to the memory cell array, to the host as the output data based on a first request of the host, or
provide the image data, which are stored to the memory cell array, to the host as the output data based on a second request of the host.

15. The electronic device of claim 14, wherein the second semiconductor chip includes an image signal processor (ISP) configured to process the image data.

16. The electronic device of claim 14, wherein
the memory cell array includes one or more dynamic random access memory (DRAM) cells, and
the second semiconductor chip is configured to provide the output data to the host based on a double data rate (DDR) interface in response to the second request of the host.

17. The electronic device of claim 16, wherein the memory cell array is configured to be operated as a cache memory of the host.

* * * * *